US012731226B2

(12) United States Patent
Lee et al.

(10) Patent No.: US 12,731,226 B2
(45) Date of Patent: Sep. 8, 2026

(54) METHOD FOR TRAINING POST-PROCESSING DEVICE FOR DENOISING MRI IMAGE AND COMPUTING DEVICE FOR THE SAME

(71) Applicant: Seoul National University R&DB Foundation, Seoul (KR)

(72) Inventors: Jongho Lee, Seoul (KR); Juhyung Park, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 717 days.

(21) Appl. No.: 17/978,264

(22) Filed: Nov. 1, 2022

(65) Prior Publication Data

US 2023/0162326 A1 May 25, 2023

(30) Foreign Application Priority Data

Nov. 22, 2021 (KR) ........................ 10-2021-0161789

(51) Int. Cl.

*G06T 5/70* (2024.01)
*G01R 33/56* (2006.01)
*G01R 33/565* (2006.01)
*G06T 5/50* (2006.01)

(52) U.S. Cl.

CPC ............ *G06T 5/70* (2024.01); *G01R 33/5608* (2013.01); *G01R 33/5659* (2013.01); *G06T 5/50* (2013.01); *G06T 2207/10088* (2013.01); *G06T 2207/20081* (2013.01); *G06T 2207/20084* (2013.01); *G06T 2207/20212* (2013.01); *G06T 2207/30168* (2013.01)

(58) Field of Classification Search

USPC ................................ 382/128, 131, 155–157
See application file for complete search history.

(56) References Cited

U.S. PATENT DOCUMENTS

| | | | | |
|---|---|---|---|---|
| 11,125,845 | B2 * | 9/2021 | Sharma | G01R 33/4835 |
| 11,324,418 | B2 * | 5/2022 | Schlemper | G06T 7/262 |
| 11,585,876 | B2 * | 2/2023 | Mostapha | G01R 33/5608 |
| 2020/0082205 | A1 | 3/2020 | Takeshima | |
| 2020/0294287 | A1 * | 9/2020 | Schlemper | G16H 30/40 |
| 2020/0300954 | A1 * | 9/2020 | Sharma | G01R 33/4835 |
| 2020/0341094 | A1 * | 10/2020 | Polak | A61B 5/7207 |
| 2022/0392018 | A1 * | 12/2022 | Chen | G06T 5/70 |
| 2023/0122658 | A1 * | 4/2023 | Kamilov | G01R 33/5608 382/131 |

FOREIGN PATENT DOCUMENTS

| | | | | |
|---|---|---|---|---|
| JP | 2020-039380 A | | 3/2020 | |
| JP | 2020-075063 A | | 5/2020 | |
| KR | 10-2021-0030063 A | | 3/2021 | |
| WO | WO2020198959 | * | 10/2020 | A61B 5/055 |

* cited by examiner

*Primary Examiner* — Ishrat I Sherali

(74) *Attorney, Agent, or Firm* — Kaplan Breyer Schwarz LLP

(57) ABSTRACT

Disclosed is a training method including outputting an MRI signal from a plurality of coils included in an MRI scanner and performing, by a computing device, supervised learning on a post-processing part included in the computing device by using, as training input data, a first image generated using a first group of coils among the plurality of coils and using, as a label, a second image generated using a second group of coils among the plurality of coils.

7 Claims, 15 Drawing Sheets

[FIG. 1]
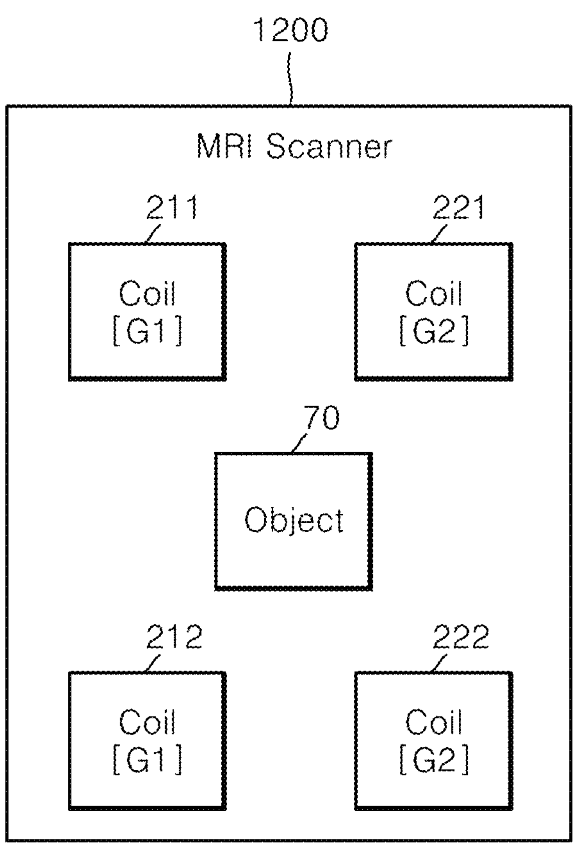

[FIG. 2]
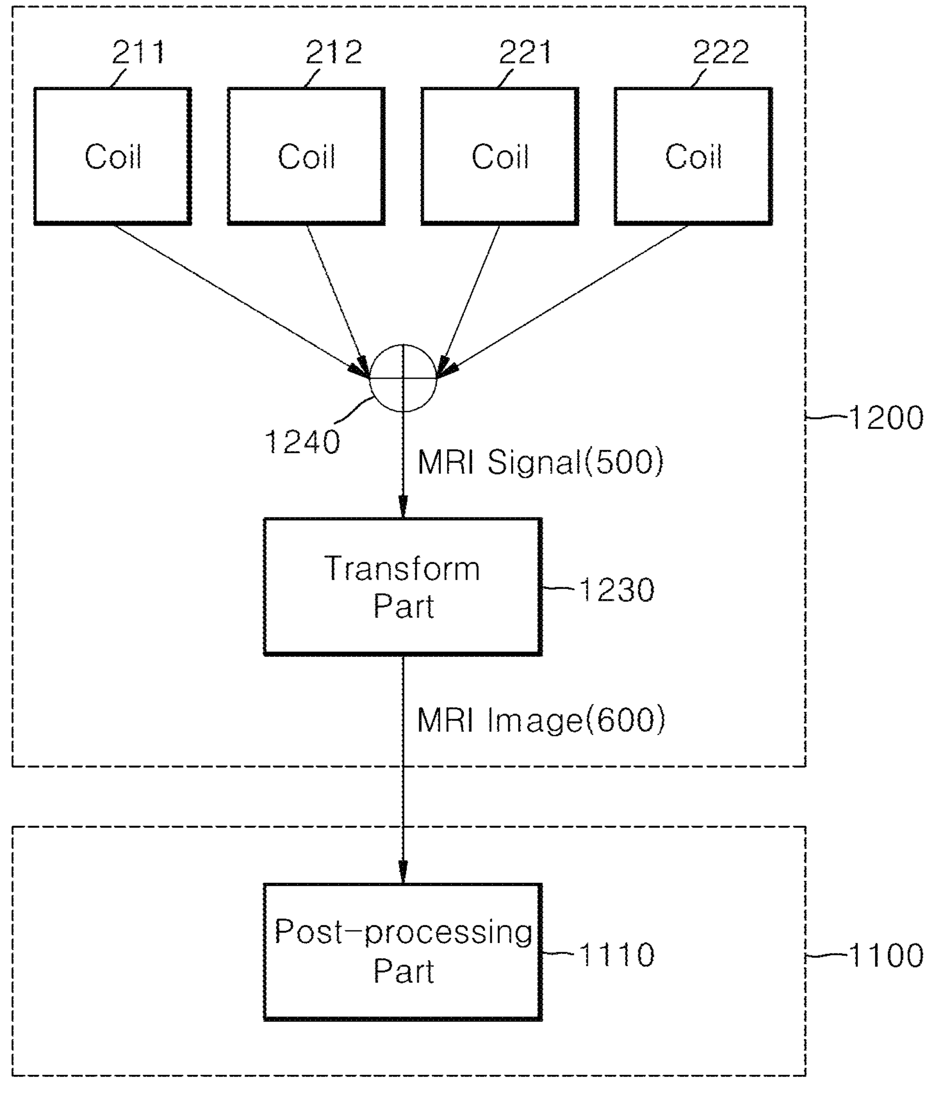

[FIG. 3]
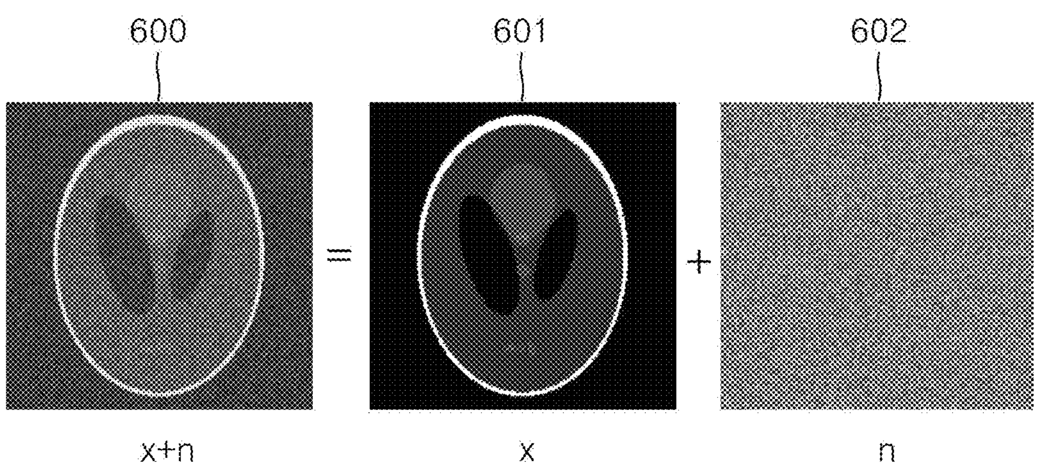
[FIG. 4]
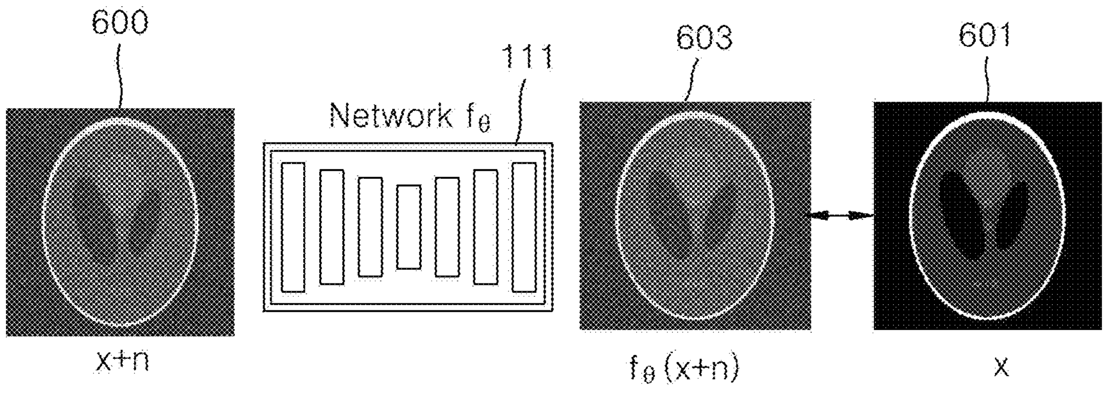

[FIG. 5]
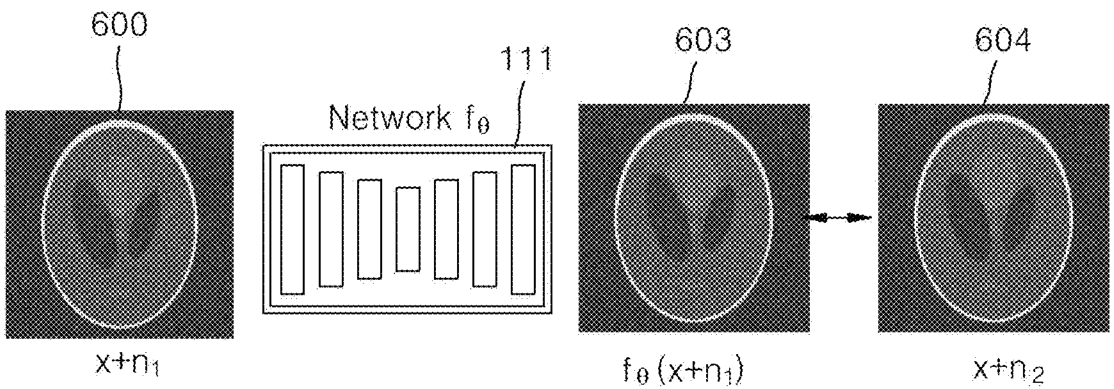

[FIG. 6]
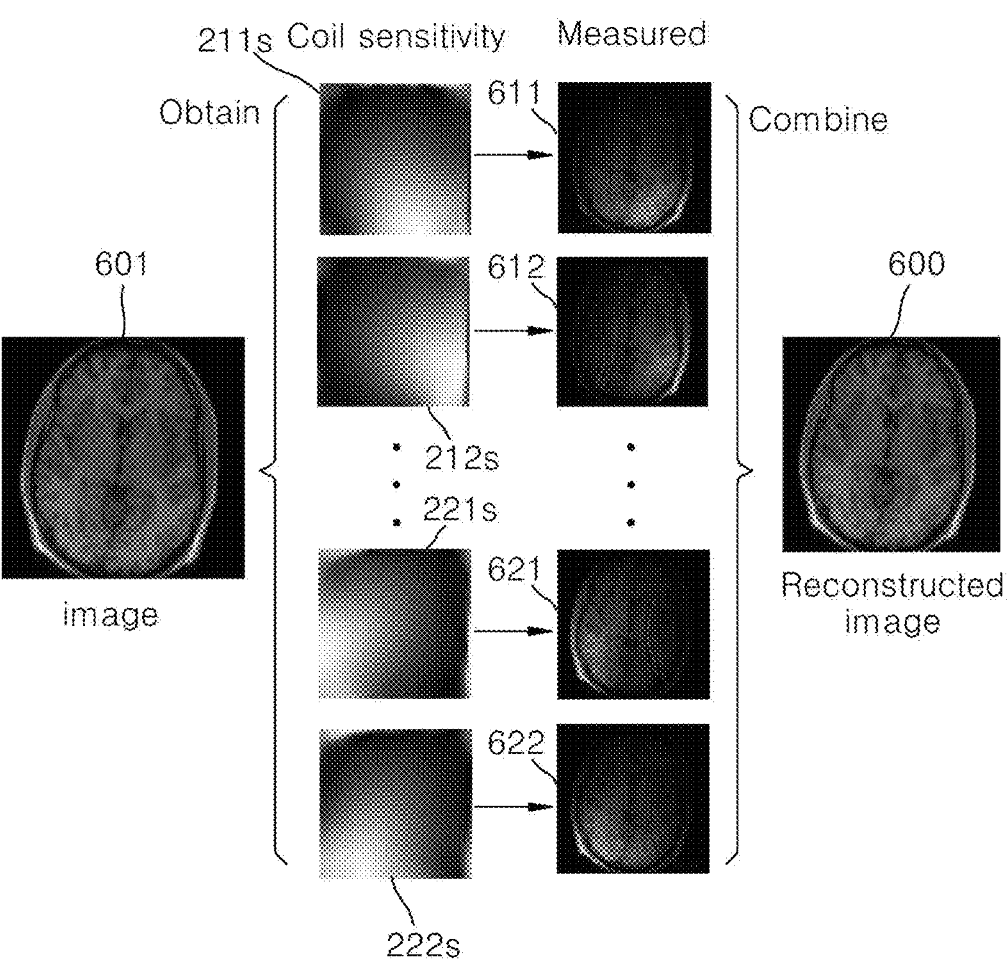

[FIG. 7]
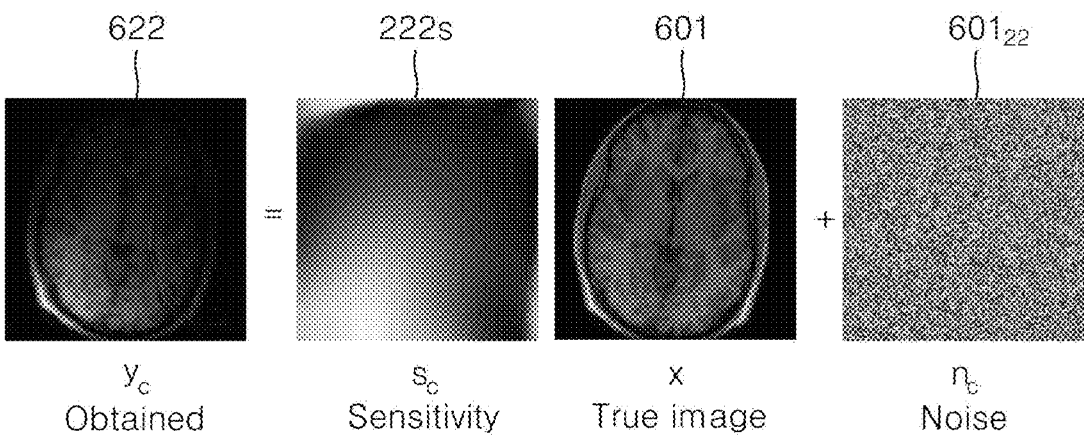

[FIG. 8]
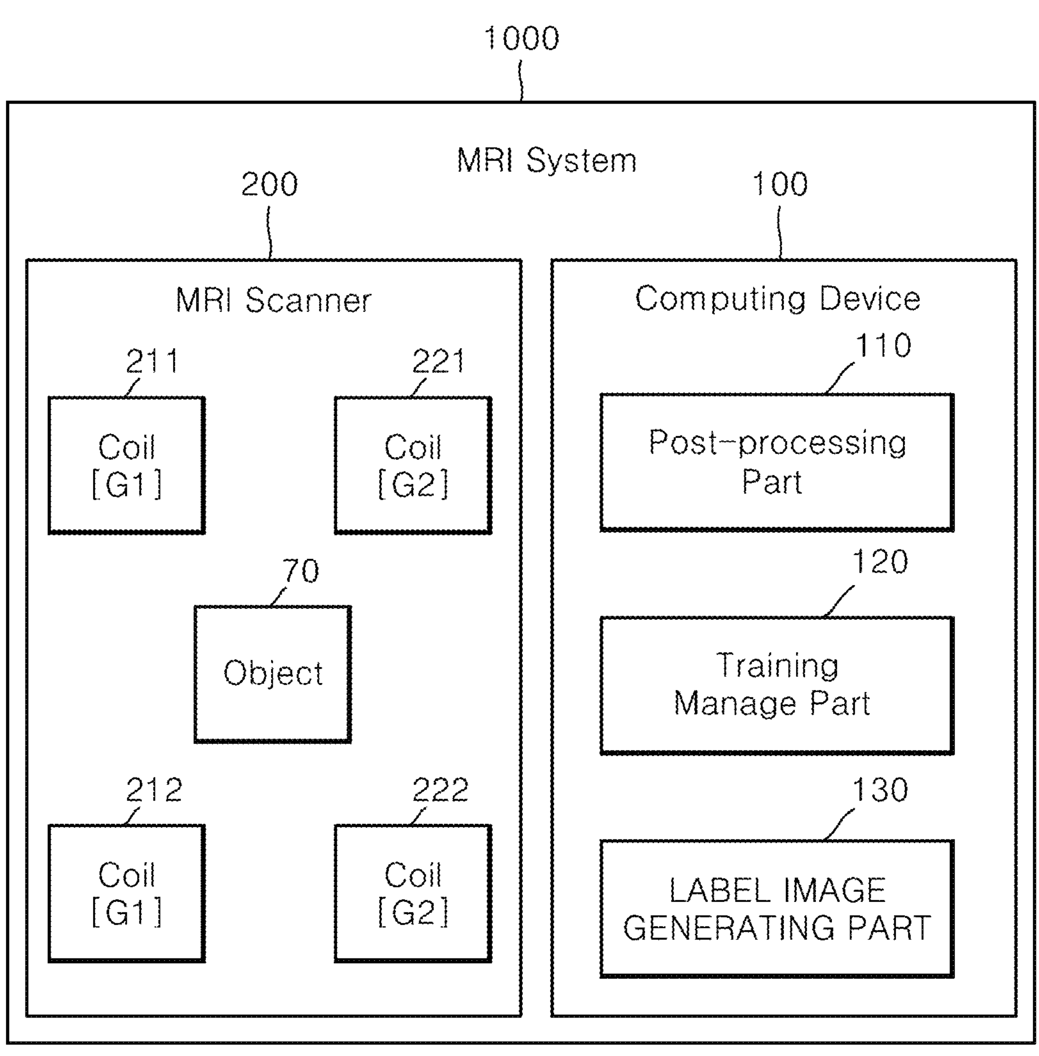

[FIG. 9]
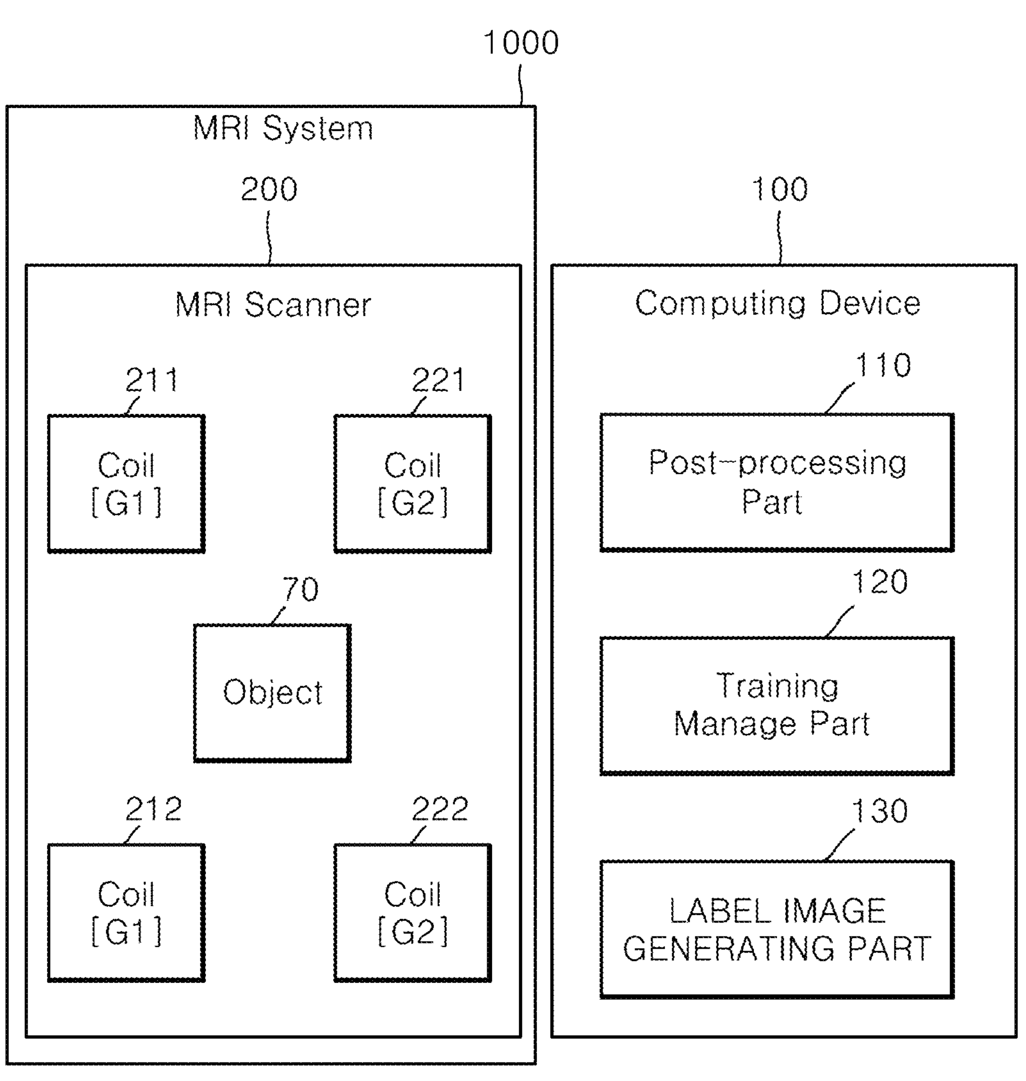

[FIG. 10]
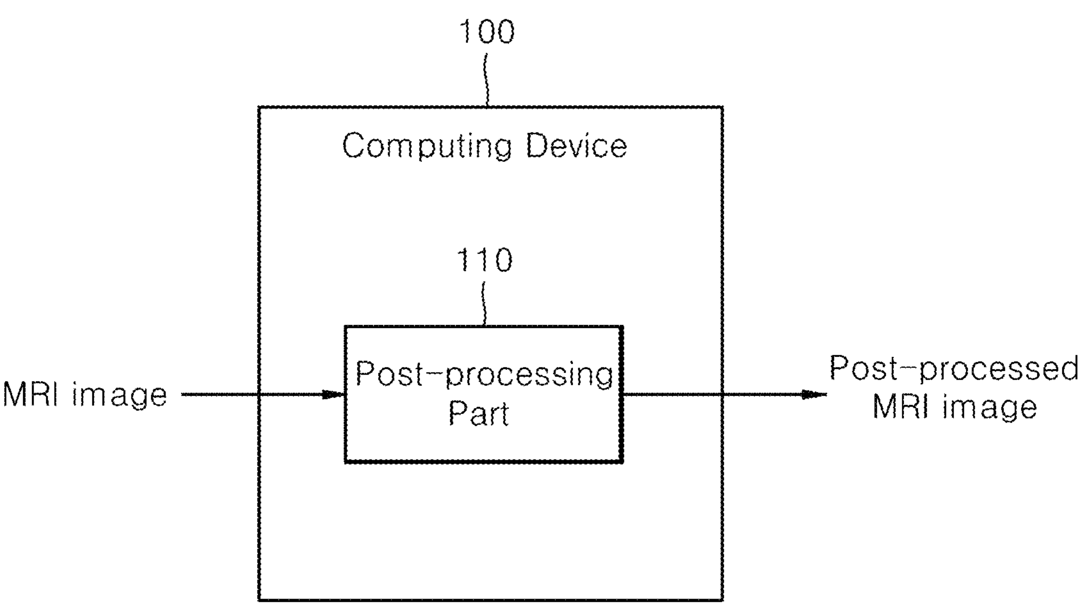

[FIG. 11A]
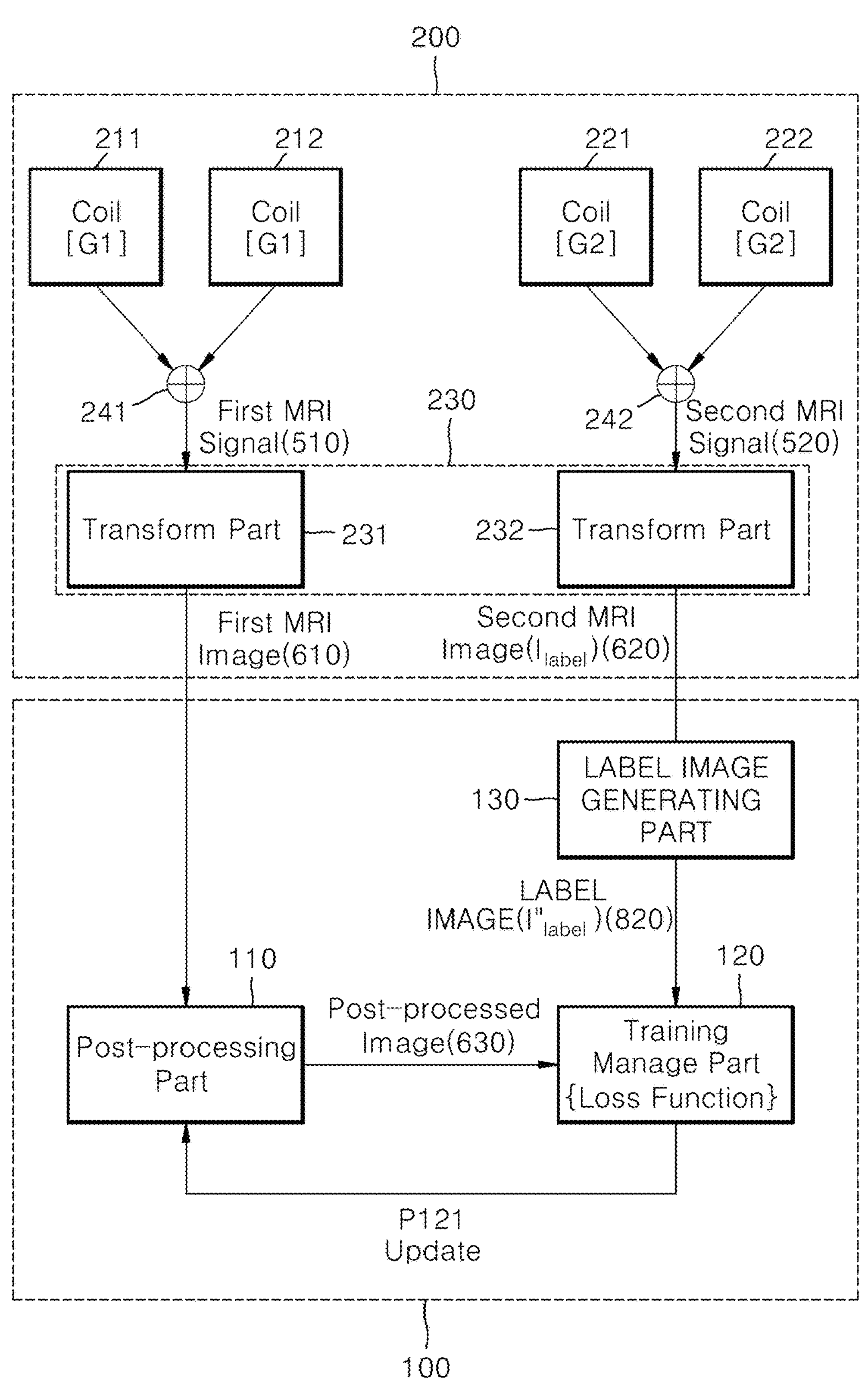

[FIG. 11B]
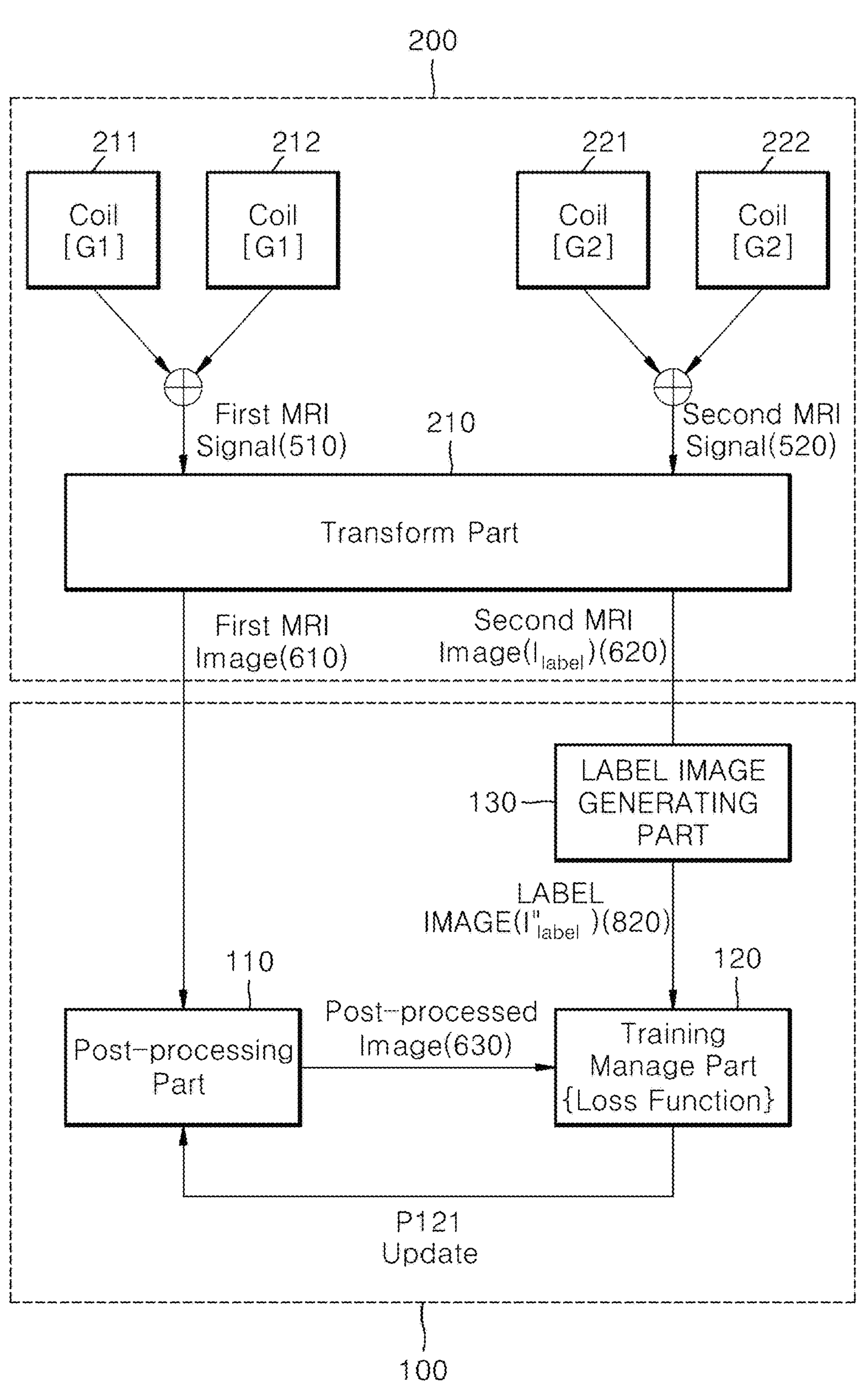

[FIG. 11C]
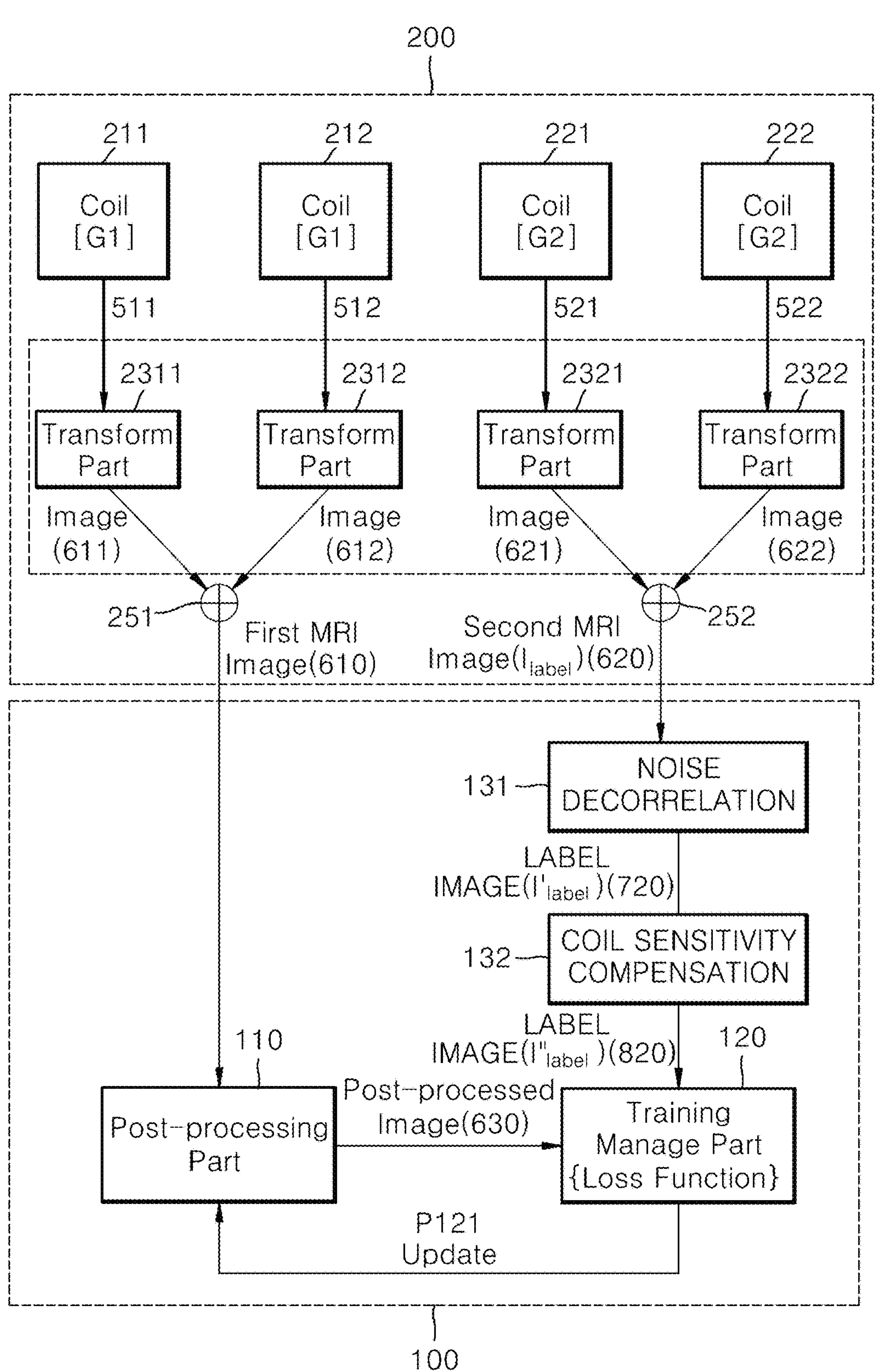

[FIG. 12]
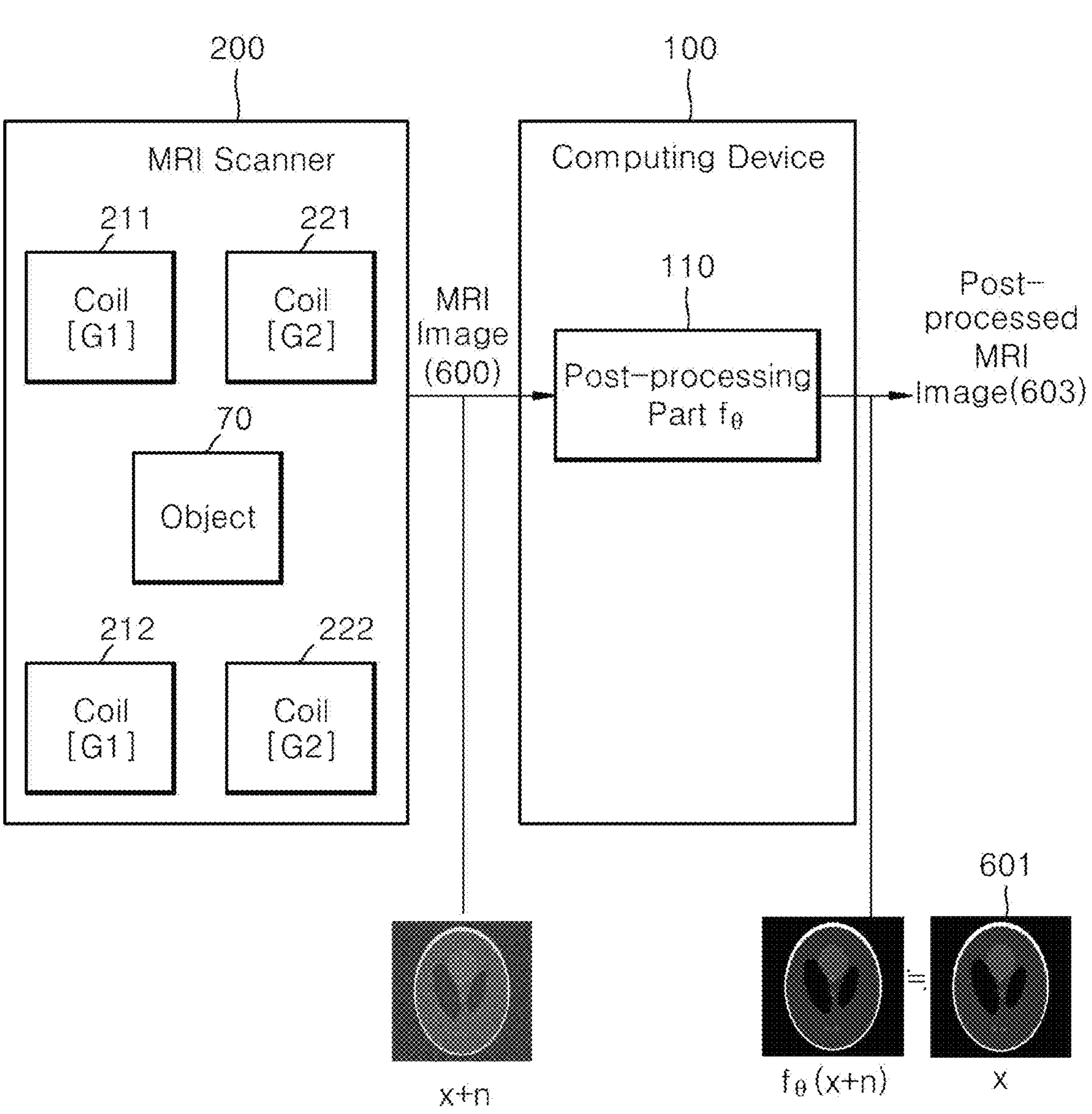

[FIG. 15]
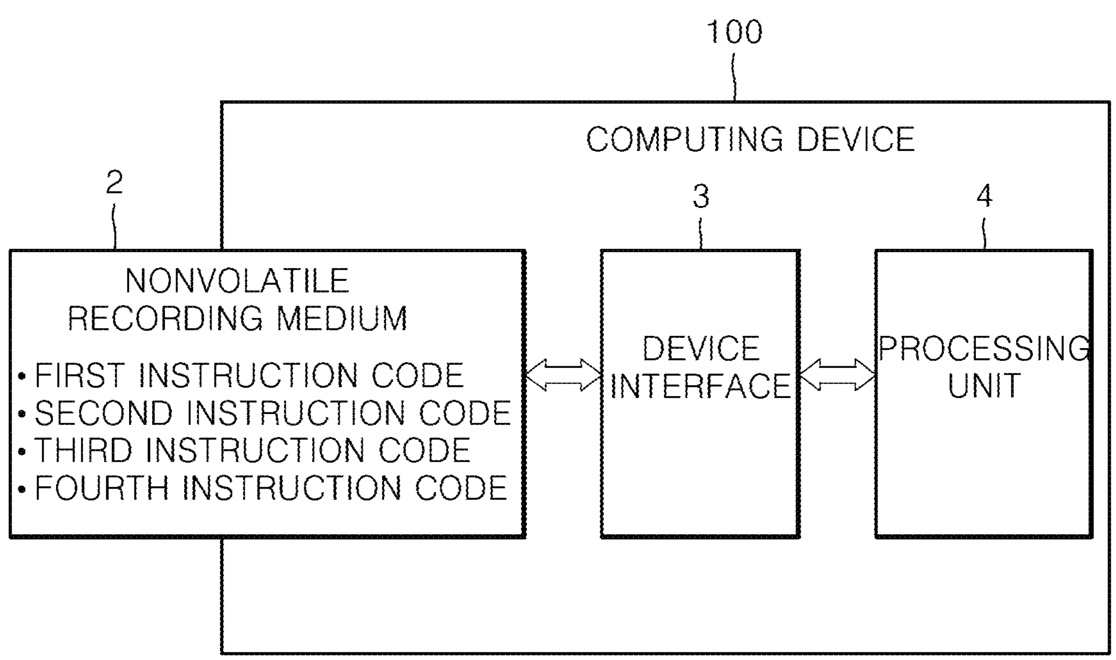

METHOD FOR TRAINING POST-PROCESSING DEVICE FOR DENOISING MRI IMAGE AND COMPUTING DEVICE FOR THE SAME

CROSS-REFERENCE TO RELATED APPLICATION

This application claims priority to Korean Patent Application No. 10-2021-0161789 filed on Nov. 22, 2021, and all the benefits accruing therefrom under 35 U.S.C. § 119, the contents of which are incorporated by reference in their entirety.

BACKGROUND

The present disclosure relates to a signal processing technology for training a post-processing device for denoising an MRI image and a computing device employing the same.

Magnetic resonance imaging (MRI), which is used in disease detection, diagnosis, and treatment monitoring, is an imaging technology for generating a three-dimensional anatomical image based on a technology for exciting and detecting a change in a rotation axis direction of protons of water in living tissue. MRI applies radiofrequency (RF) energy to a region of interest of a human body in a magnet having a strong external magnetic field to resonate hydrogen nuclei in the region of interest of the body, measures a signal coming from corresponding tissue, and reconstructs the signal by a computer to transform the signal into cross-section and three-dimensional images. An MRI scanner that enables MRI is a device including a patient table, a scanner, a magnet, a gradient coil, and a radiofrequency coil.

FIG. 1 illustrates a main configuration of an MRI scanner 1200 that enables MRI. A space in which an object 70 to be detected may be disposed may be formed in the MRI scanner 1200. The object 70 may be, for example, a person. The MRI scanner 1200 may include a plurality of coils 211, 212, 221, and 222 arranged therein, and may receive a signal generated from the object 70 through the coils. Although FIG. 1 illustrates four coils for convenience, the number of coils may not be limited thereto. The MRI scanner 1200 may further include therein other coils that output RF pulses.

FIG. 2 is a diagram illustrating a process of generating a K-space or MRI image using an MRI signal obtained by the MRI scanner illustrated in FIG. 1.

An MRI signal 500 may be generated by combining all of signals output from the plurality of coils 211, 212, 221, and 222. The MRI signal 500 may be transformed into an MRI image 600 through a predetermined transformation algorithm. The MRI signal 500 may be K-space data. An example of the MRI image 600 is illustrated in FIG. 3.

The signals output from each of the coils may be signals constituting a portion of the K-space data. One complete piece of K-space data may be generated using all of the signals output from the plurality of coils. The complete K-space data may be transformed into the MRI image 600 through the predetermined transformation algorithm.

In an embodiment, a process of transforming the MRI signal 500 into the MRI image 600 may be performed in a transform part 1230 included in the MRI scanner 1200.

In another embodiment, the process of transforming the MRI signal 500 into the MRI image 600 may be performed in a separate computing device 1100.

The MRI image 600 may be further processed by a post-processing part 1110 implemented in the computing device 1100. For example, noise in the MRI image 600 may be processed and reduced by the post-processing part 1110.

In an embodiment, the MRI scanner 1200 and the computing device 1100 may be an integrally provided MRI system.

In another embodiment, the MRI scanner 1200 may be an MRI system provided independent of the computing device 1100. Here, the MRI scanner 1200 and the computing device 1100 may be communicatively connected to each other by a local network or metropolitan network.

The embodiment illustrated in FIG. 2, the signals output from the four coils are input to the transform part 1230 after being combined by a signal combining part 1240. However, in a modified embodiment, the signals output from the four coils may be directly input to the transform part 1230 without passing through the signal combining part 1240, and may be combined with each other in the transform part 1230.

FIG. 3 is a diagram illustrating a concept of an MRI image including noise.

The MRI image 600 ($x+n$) obtained by transforming the K-space data may include a true image 601 ($x$) and noise 602 ($n$).

FIG. 4 illustrates a method of denoising an MRI image using a supervised learning technology according to the related art.

The MRI image 600 ($x+n$) may be input to a network 111 ($f_\theta$). An operation objective of the network 111 ($f_\theta$) is to output a post-processed image 603 ($f_\theta(x+n)$) that is a denoised image from the MRI image 600 ($x+n$). To this end, a parameter θ constituting the network 111 ($f_\theta$) is required to be optimized. To this end, the parameter θ is required to be optimized so as to minimize a loss function L between the true image 601 ($x$) and the post-processed image 603 ($f_\theta(x+n)$) for the MRI image 600 ($x+n$).

The loss function L may be referred to as L2 loss.

According to the technology illustrated in FIG. 4, the true image 601 ($x$) that is a ground truth image for the MRI image 600 ($x+n$) is required to be prepared in advance, but it may be very difficult or impossible to simply prepare the true image 601 ($x$).

There may be another technology for obtaining the true image 601 ($x$). Notwithstanding, the present invention is intended to provide a technology for obtaining an image with quality that is equal to or similar to the quality of the true image more quickly or more efficiently using an MRI scanner in comparison with the other technology.

FIG. 5 illustrates a method of denoising an MRI image using another supervised learning technology that may be compared with a best mode of the present invention.

Although the MRI image indicated by reference number 600 shown in FIG. 4 is expressed by x+n, the MRI image indicated by reference number 600 is expressed by $x+n_1$ in FIG. 5 for convenience.

In the example of FIG. 4, the true image 601 ($x$) is used as a supervised learning label for the MRI image 600 ($x+n$). On the contrary, in the technology illustrated in FIG. 5, another label image 604 ($x+n_2$) that is different from the true image 601 ($x$) is used as a label for the MRI image 600 ($x+n$). In a network training method described with reference to FIG. 5, the parameter θ is optimized so as to minimize the loss function L between the other label image 604 ($x+n_2$) and the post-processed image 603 ($f_\theta(x+n_1)$).

The loss function L may be defined as Equation 1.

$$\text{loss}=|f_\theta(x+n_1)-(x+n_2)|_2^2 \quad \text{[Equation 1]}$$

Here, the true image (x) obtained by eliminating noise $n_2$ from the other label image 604 ($x+n_2$) is the same as the true image (x) obtained by eliminating noise $n_1$ from the MRI image 600 ($x+n_1$).

Here, when conditions that ① $n_1$ and $n_2$ be independent i.i.d, ② $E[n_1]=E[n_2]=0$, ③ $n_1$ and $n_2$ be symmetric, and ④ L2 norm loss are satisfied, the technology illustrated in FIG. 5 exhibits substantially the same effect as the technology illustrated in FIG. 4. That is, when the above conditions are satisfied, the same training effect may be achieved even if the network 111 ($f_\theta$) is trained using the other label image 604 ($x+n_2$) in which other noise ($n_2$) is combined with the true image (x) instead of using the true image 601 ($x$) as a label image. Notwithstanding, for the technology illustrated in FIG. 5, the other label image 604 ($x+n_2$) for the MRI image 600 ($x+n_1$) is required to be prepared, but it may also be very difficult or impossible to prepare the other label image 604 ($x+n_2$).

FIG. 6 is a diagram illustrating images measured by using the plurality of coils included in the MRI scanner illustrated in FIG. 1 and a method of generating an MRI image using the images.

The horizontal axis and vertical axis of each of the images having a rectangular boundary shown in FIG. 6 may represent an x and y coordinates in a space in the MRI scanner.

Reference number 601 in FIG. 6 indicates a true image (ground truth image) of a portion to be obtained using the MRI scanner.

Each of the plurality of coils 211, 212, 221, and 222 does not have the same sensitivity for all coordinates in the true image 601 ($x$). That is, each of the coils may have higher sensitivity for a space closer to itself. This difference in sensitivity due to a position of a space may be caused by a characteristic difference between the coils. And/or, this difference in sensitivity due to a position of a space may be caused by a difference in a position of each coil arranged in the MRI scanner.

The four sample images **211*s*, 212*s*, 221*s*, and 222*s* shown in the second column in FIG. 6 indicate, by light and shade, a magnitude of sensitivity that a coil corresponding to each sample image has for the x and y coordinates. Referring to the four sample images 211*s*, 212*s*, 221*s*, and 222*s* shown in the second column in FIG. 6, it may be recognized that space distributions of the sensitivities of the plurality of coils 211, 212, 221, and 222** are different from each other.

For example, reference numbers **211*s*, 212*s*, 221*s*, and 222*s* in FIG. 6 indicate sensitivity maps according to the x and y coordinates of the coil 211, coil 212, coil 221, and coil 222**, respectively. In each of the maps, a brighter portion indicates higher sensitivity.

For example, reference numbers 611, 612, 621, and 622 indicate four sub-images generated using signals measured by each of the coil 211, coil 212, coil 221, and coil 222. Each of the sub-images may include noise, and at least a portion of the noise may be generated by a coil corresponding to each of the sub-images.

A reconstructed image 600 may be generated by combining the sub-image 611, the sub-image 612, the sub-image 621, and the sub-image 622. The MRI image 600 ($x+n_1$) shown in FIG. 5 may be an image in which the noise $n_1$ is added to the true image 601 ($x$).

FIG. 7 is a diagram for describing an equation that represents a relationship between a sub-image obtained by a coil [c] having an index c among the above coils and the sensitivity of the coil [c].

For convenience, the coil [c] is assumed to be the above coil 222.

When noise 601$_{22}$ is combined with a result of measuring the true image 601 ($x$) with the sensitivity **222*s* of the coil 222, the sub-image 622** may be obtained.

Here, the true image 601 ($x$) may be denoted by x, **222*s* may be denoted by $s_c$, the sub-image 622 may be denoted by $y_c$, and the noise 601**$_{22}$ may be denoted by $n_c$. Here, [Equation 2] is established.

$$y_c=s_c x+(n_{c,real}+jn_{c,image}),(c\in 1 \ldots k),n=N(0,\sigma^2) \qquad \text{[Equation 2]}$$

$y_c$, $s_c$, x, $n_c \in R^2$

Here, $s_c$ is a value that may be obtained in advance using a device characteristic of the MRI scanner.

Now, $s_c^H$ satisfying [Equation 3} may be determined for all of the coils included in the MRI scanner.

$$\Sigma_c s_c^H s_c=1 \qquad \text{[Equation 3]}$$

Here, each of $s_c$ and $s_c^H$ may be a matrix.

Now, [Equation 4] is satisfied by multiplying sub-images obtained for all of the coils included in the MRI scanner by $s_c^H$ and adding up resultant values. Here, the subscript c has a different value for a different coil.

$$I_{input}=\Sigma_c s_c^H y_c=\Sigma_c s_c^H s_c x+s_c^H n_c=x+\Sigma_c s_c^H n_c \qquad \text{[Equation 4]}$$

According to [Equation 4], it may be recognized that a result of adding up the sub-images obtained for all of the coils included in the MRI scanner is a combination of the true image (x) and the noise term $s_c^H n_c$. $I_{input}$ denotes a detection image, output from the MRI scanner, including noise.

Now, as illustrated in FIG. 4, the network 111 may be trained using the loss function between the true image (x) and the post-processed image $f_\theta(I_{input})$ obtained by inputting $I_{input}$ of [Equation 4] to the network 111. However, also in this case, it may be difficult to obtain the true image (x) in advance as described above.

SUMMARY

The present disclosure provides a specific technology for generating label data and training data for supervised learning of a post-processing part for denoising an MRI image.

According to one aspect of the present invention, a magnetic resonance imaging (MRI) system can be provided. The MRI system comprises an MRI scanner including a first group of coils and a second group of coils; and a computing device including a post-processing part for post-processing an MRI image and a training management part. Here, a first image generated based on signals obtained from the first group of coils is used as training input data for supervised learning of the post-processing part, a second image generated based on signals obtained from the second group of coils is used as a label for supervised learning of the post-processing part, and the training management part is configured to perform supervised learning on the post-processing part using the training input data and the label.

In an MRI system provided according to an aspect of the present invention, a first group of coils and a second group of coils may be phased-array coils.

Here, the first image may be a first MRI image generated based on a first group of MRI signals obtained from the first group of coils. Further, generating of the second image may include generating a second MRI image based on a second group of MRI signals obtained from the second group of coils; generating an intermediate label image based on the second MRI image so as to eliminate a correlation between first noise in the first MRI image and second noise in the second MRI image; and generating a label image based on the intermediate label image so as to compensate for a difference in sensitivity between the first group of coils and the second group of coils, and the second image is the generated label image.

Here, the first MRI image may be an image obtained by synthesizing images of a first group generated from the MRI signals of the first group obtained from the first group of coils, the second MRI image may be an image obtained by synthesizing images of a second group generated from the MRI signals of the second group obtained from the second group of coils, and the MRI scanner may include a transform part configured to generate the images of the first group from the MRI signals of the first group and generate the images of the second group from the MRI signals of the second group.

Here, the intermediate label image may be generated based on a weighted sum of the first MRI image and the second MRI image.

Here, the first image may be a first MRI image generated based on a first group of MRI signals obtained from the first group of coils. Further, generating of the second image may include generating a second MRI image based on a second group of MRI signals obtained from the second group of coils; and generating a label image based on the second MRI image so as to compensate for a difference in sensitivity between the first group of coils and the second group of coils, the second image is the generated label image.

Herein, the first image is the first MRI image generated based on the MRI signals of the first group obtained from the first group of coils, and the second image is the second MRI image generated based on the MRI signals of the second group obtained from the second group of coils.

Here, while performing the supervised learning, the post-processing part may be configured to receive an input of the first image to generate a post-processed image, the training management part is configured to train the post-training part using a loss function between the post-processed image and the second image.

Here, the first image and the second image may be obtained through the same one-time data acquisition process performed by the MRI scanner.

Here, the first MRI image and the second MRI image may be obtained through the same one-time data acquisition process performed by the MRI scanner.

Here, there may be no correlation between first noise in the first MRI image and second noise in the second MRI image.

Here, each coil of the first group of coils and the second group of coils may be configured to output, only one time, an MRI signal corresponding to the each coil in the one-time data acquisition process.

Here, each of the first image and the second image may be a cross-sectional image of an object scanned by the MRI scanner.

According to another aspect of the present invention, a neural network training method for training a post-processing part configured to receive an input of a magnetic resonance imaging (MRI) image and denoise the MRI image can be provided. The method comprises generating, by an MRI scanner including a first group of coils and a second group of coils, a first image based on signals obtained from the first group of coils; generating, by the MRI scanner, a second image based on signals obtained from the second group of coils; and performing, by a computing device, supervised learning on the post-processing part by using the first image as training input data for supervised learning of the post-processing part and using the second image as a label for supervised learning of the post-processing part.

According to still another aspect of the present invention, a magnetic resonance imaging (MRI) system can be provided. The MRI system comprises an MRI scanner including a first group of coils and a second group of coils and configured to output an MRI image; and a computing device including a trainable post-processing part and a training management part configured to train the post-processing part. Here, the post-processing part is configured to, during a training process of the post-processing part, receive an input of a first image generated based on signals obtained from the first group of coils to generate a training post-processed image, the training management part is configured to, during the training process of the post-processing part, train the post-training part using a loss function between the training post-processed image and a second image generated based on signals obtained from the second group of coils, and the post-processing part is configured to receive the MRI image to output an image obtained by denoising the MRI image after the training process of the post-processing part is completed.

According to still another aspect of the present invention, a method of denoising a magnetic resonance imaging (MRI) image can be provided. The method comprises outputting, by an MRI scanner, an MRI signal from a plurality of coils included in the MRI scanner; and inputting, by a computing device, an MRI image generated using signals obtained from the plurality of coils to a post-processing part included in the computing device to generate a post-processed image obtained by denoising the MRI image. Here, the post-processing part is trained using a supervised learning method. Here, the supervised learning method includes generating, by a second MRI scanner including a first group of coils and a second group of coils, a first image based on signals obtained from the first group of coils; generating, by the second MRI scanner, a second image based on signals obtained from the second group of coils; and performing, by a second computing device, supervised learning on the post-processing part by using the first image as training input data for supervised learning of the post-processing part and using the second image as a label for supervised learning of the post-processing part.

An MRI scanner provided according to an aspect of the present invention may generate K-spaces of a first group from a first group of MRI signals and generate images of a first group from the K-spaces of the first group. Furthermore, the MRI scanner may generate K-spaces of a second group from a second group of MRI signals and generate images of a second group from the K-spaces of the second group.

According to an embodiment of the present invention, provided is an MRI system including: an MRI scanner; and a computing device including a post-processing part for post-processing an MRI image and a training management part. The training management part is configured to perform supervised learning on the post-processing part by using, as training input data, a first image generated using a signal obtained from a first group of coils among the plurality of coils included in the MRI scanner and using, as a label, a second image generated using a signal obtained from a second group of coils among the plurality of coils.

The supervised learning method includes: generating, by a second MRI scanner, a first image by transforming a first MRI signal obtained by a first group of coils included in the second MRI scanner; generating, by the second MRI scanner, a second image by transforming a second MRI signal obtained by a second group of coils included in the second MRI scanner; and performing, by a second computing device, supervised learning on the post-processing part by using the first image as training input data and using the second image as a label.

Here, the second computing device may be the same device as the computing device, the second MRI scanner may be the same device as the MRI scanner, and the plurality of coils included in the MRI scanner may include the first group of coils and the second group of coils.

Here, the post-processing part may be configured to receive an input of the first image to generate a post-processed image, and the second computing device may be configured to train the post-processing part using a loss function between the post-processed image and the second image.

A training method according to another aspect of the present invention may include: outputting, by an MRI scanner, an MRI signal from a plurality of coils included in the MRI scanner; and performing, by a computing device for post-processing an MRI image, supervised learning on a post-processing part included in the computing device by using, as training input data, a first image generated using a signal obtained from a first group of coils among a plurality of coils included in the MRI scanner and using, as a label, a second image generated using a signal obtained from a second group of coils among the plurality of coils.

Here, the performing supervised learning may include: receiving, by the post-processing part, an input of the first image generated by transforming a first MRI signal obtained by the first group of coils to generate a post-processed image; and training, by a training management part included in the computing device, the post-processing part using a loss function between the post-processed image and a second image generated by transforming a second MRI signal obtained by the second group of coils.

Here, the first image and the second image may be obtained through the same one data acquisition process performed by the MRI scanner.

Here, in the one data acquisition process, each of the plurality of coils included in the MRI scanner may be configured to output an MRI signal one time.

Here, the post-processing part may include a neural network.

Here, the computing device may be configured to generate a first K-space corresponding to the first MRI signal by transforming the first MRI signal and generate the first image (first MRI image) corresponding to the first MRI signal, and configured to generate a second K-space corresponding to the second MRI signal by transforming the second MRI signal and generate a second MRI image corresponding to the second MRI signal.

A computing device according to another aspect of the present invention may include a post-processing part for post-processing an MRI image and a training management part, wherein the training management part may be configured to perform supervised learning on the post-processing part by using, as training input data, a first image generated using a signal obtained from a first group of coils among a plurality of coils included in an MRI scanner and using, as a label, a second image generated using a signal obtained from a second group of coils among the plurality of coils.

Here, the post-processing part may be configured to receive an input of the first image generated by transforming a first MRI signal obtained by the first group of coils to generate a post-processed image, and the training management part may be configured to train the post-processing part using a loss function between the post-processed image and a second image generated by transforming a second MRI signal obtained by the second group of coils.

Here, the first image and the second image may be obtained through the same one data acquisition process performed by the MRI scanner.

An MRI system according to another aspect of the present invention includes: an MRI scanner for outputting an MRI image; and a computing device including a post-processing part for outputting a post-processed image by denoising the MRI image, wherein the post-processing part may be supervised-trained by using, as training input data, a first image generated using a signal obtained from a first group of coils among a plurality of coils included in the MRI scanner and using, as a label, a second image generated using a signal obtained from a second group of coils among the plurality of coils.

Here, the computing device may further include a post-processing part, wherein the post-processing part may be configured to receive an input of the first image generated by transforming a first MRI signal obtained by the first group of coils to generate a post-processed image, and the training management part may be configured to train the post-processing part using a loss function between the post-processed image and a second image generated by transforming a second MRI signal obtained by the second group of coils.

Here, the first image and the second image may be obtained through the same one data acquisition process performed by the MRI scanner.

Here, the MRI scanner and the computing device may be connected to each other by a local network, or may be different devices not connected by a local network.

A method of denoising an MRI image according to another aspect of the present invention may include: outputting, by an MRI scanner, an MRI signal from a plurality of coils included in the MRI scanner; and inputting, by a computing device, an MRI image generated using signals obtained from the plurality of coils to a post-processing part included in the computing device to generate a post-processed image obtained by denoising the MRI image. The post-processed part may be one that has been supervised-trained according to a supervised learning method. The supervised learning method may include: outputting, by one MRI scanner among the MRI scanner and another MRI scanner, a second MRI signal from a plurality of coils included in the one MRI scanner; and performing, by one computing device among the computing device and another computing device, supervised learning on the post-processing part by using, as training input data, a first image generated using a signal obtained from a first group of coils among a plurality of coils included in the one MRI scanner and using, as a label, a second image generated using a signal obtained from a second group of coils among the plurality of coils.

BRIEF DESCRIPTION OF THE DRAWINGS

Exemplary embodiments can be understood in more detail from the following description taken in conjunction with the accompanying drawings, in which:

FIG. 1 illustrates a main configuration of an MRI scanner;

FIG. 2 is a diagram illustrating a process of generating a K-space or MRI image using an MRI signal obtained by the MRI scanner illustrated in FIG. 1;

FIG. 3 is a diagram illustrating a concept of an MRI image including noise;

FIG. 4 illustrates a method of denoising an MRI image according to a comparative embodiment;

FIG. 5 illustrates a method of denoising an MRI image according to another comparative embodiment;

FIG. 6 is a diagram illustrating images measured by using a plurality of coils included in an MRI scanner and a method of generating an MRI image using the images;

FIG. 7 is a diagram for describing an equation that represents a relationship between a sub-image obtained by a coil [c] having an index c among coils and sensitivity of the coil [c];

FIG. 8 is a diagram illustrating a configuration of an MRI system provided according to an embodiment of the present invention;

FIG. 9 is a diagram illustrating a configuration of an MRI system provided according to an embodiment of the present invention modified from FIG. 8;

FIG. 10 is a diagram illustrating a function performed by a computing device provided according to an embodiment of the present invention after training of a post-processing part is completed;

FIG. 11A is a diagram illustrating a process of generating two images through a one-time data acquisition process in an MRI scanner and training a post-processing part by using the two images according to an embodiment of the present invention;

FIG. 11B illustrates an embodiment modified from the embodiment illustrated in FIG. 11A;

FIG. 11C illustrates a configuration of a system, which is provided according to a preferred embodiment of the present invention, for performing a training method of a post-processing part for denoising an MRI image;

FIG. 12 illustrates a method of denoising an MRI image using a trained post-processing part according to an embodiment of the present invention; and FIG. 13 is a flowchart illustrating a training method provided according to an embodiment of the present invention.

FIG. 14 is a flowchart illustrating the supervised learning operation of FIG. 13 in detail.

FIG. 15 is a diagram illustrating the computing device shown in FIGS. 9, 10, and 12 from a hardware aspect.

DETAILED DESCRIPTION OF EMBODIMENTS

Embodiments of the present invention will be described with reference to the accompanying drawings. However, the present invention is not limited to the embodiments described herein, and may be implemented in various different forms. The terminology used herein is not for limiting the scope of the present invention but for describing the embodiments. Furthermore, the singular forms used herein include the plural forms as well, unless otherwise indicated.

FIG. 8 is a diagram illustrating a configuration of an MRI system provided according to an embodiment of the present invention.

An MRI system 1000 may include an MRI scanner 200 and a computing device 100.

In the case where the MRI scanner 200 and the computing device 100 are integrally provided, the MRI system may be simply referred to as an MRI scanner.

The MRI scanner 200 may include a plurality of coils 211, 212, 221, and 222. The MRI scanner 200 has a space capable of accommodating an object 70.

The number of the plurality of coils may be, for example, N in total, but only four coils are illustrated in FIG. 8 for convenience.

The plurality of coils are divided into a plurality of groups, for example, two groups.

In the example of FIG. 8, the plurality of coils 211, 212, 221, and 222 are divided into first group coils 211 and 212 [G1] and second group coils 221 and 222 [G2]. The first group is indicated by symbol G1, and the second group is indicated by symbol G2.

In an embodiment, a total number of coils included in the first group and a total number of coils included in the second group may be different from each other. Alternatively, in another embodiment, the total number of coils included in the first group and the total number of coils included in the second group may be the same. However, the present invention is not limited by the number of coils included in each coil.

In a preferred embodiment, a union of the first group of coils and the second group of coils is the same as a set of all of coils included in the MRI scanner 200. Here, there may be no overlapping coil between the first group of coils and the second group of coils.

The computing device 100 may include a post-processing part 110, a training management part 120, and a label image generating part 130.

The post-processing part 110 may be a trainable network. For example, the post-processing part 110 may include an artificial intelligence network, a neural network, or a machine learning network.

The training management part 120 may be configured to manage a training process of the post-processing part 110.

In an embodiment of the present invention, a second MRI image 620 may be used as a label for supervised learning as it is.

In a preferred embodiment of the present invention, an image generated by correcting the second MRI image 620, i.e., a label image, may be used as a label for supervised learning. The label image generating part 130 is configured to generate the label image by correcting the second MRI image 620.

A label generation process for generating, by the label image generating part 130, the label image from the second MRI image 620 may include correcting the second MRI image 620 based on a difference in sensitivity between the first group of coils and the second group of coils. Furthermore, the label generation process may further include correcting the second MRI image 620 by eliminating a correlation between noise included in a first MRI image and noise included in the second MRI image.

When training of the post-processing part 110 is completed, the post-processing part 110 may autonomously operate without intervention of the training management part 120.

FIG. 9 is a diagram illustrating a configuration of an MRI system provided according to an embodiment of the present invention modified from FIG. 8.

FIG. 9 illustrates the same structure as that illustrated in FIG. 8 except that the computing device 100 is separated from the MRI system 1000.

FIG. 10 is a diagram illustrating a function performed by a computing device provided according to an embodiment of the present invention after training of a post-processing part is completed.

The computing device 100 may obtain an MRI image output from the MRI scanner 200 and provide the MRI image to the post-processing part 110.

The MRI image may be an image including noise. The MRI image may be an image generated using all of the coils included in the MRI scanner 200. For example, the MRI image may be an image including noise and indicated by reference number 600 in FIG. 2, 3, 4, or 5.

The post-processing part 110 may output a denoised image by processing the MRI image including noise. Performance of the post-processing part 110 may be evaluated to be better as an image output from the post-processing part 110 is closer to the true image (x).

FIG. 11A is a diagram illustrating a process of generating two images through a one-time data acquisition process in an MRI scanner and training a post-processing part by using the two images according to an embodiment of the present invention.

Here, the "one-time data acquisition process" may represent a process of acquiring one output signal from each of substantially available coils among the coils included in the MRI scanner 200.

Here, the coils may have a signal detection function.

As described above, the plurality of coils included in the MRI scanner 200 are divided into a plurality of groups, for example, two groups.

FIG. 11A illustrates an example in which the coils 211 and 212 belong to the first group G1 among the plurality of groups and the coils 221 and 222 belong to the second group G2 among the plurality of groups.

The MRI scanner 200 or the MRI system 1000 may be configured to generate a first MRI signal 510 including signals output from the first group G1 of coils and generate a second MRI signal 520 including signals output from the second group of coils G2.

In a preferred embodiment, the signals output from the second group G2 of coils may not be included in the first MRI signal 510, and the signals output from the first group G1 of coils may not be included in the second MRI signal 520.

A transform part 230 included in the MRI scanner 200 or the MRI system 1000 may be configured to transform the first MRI signal 510 into a first image 610 (=first MRI image) ($I_{input}$) and transform the second MRI signal 520 into the second MRI image 620 ($I_{label}$).

In the present disclosure, the first image 610 ($I_{input}$) may be referred to as a first MRI image 610 ($I_{input}$).

In an embodiment of the present invention, the transform part 230 may include a first transform part 231 for transforming the first MRI signal 510 into the first MRI image 610 and a second transform part 232 for transforming the second MRI signal 520 into the second MRI image 620.

The first image 610 ($I_{input}$) generated using the signals output from the first group G1 of coils may be provided as training input data of the post-processing part 110. The post-processing part 110 may output a post-processed image 630 generated by post-processing the first image 610 ($I_{input}$). The post-processed image 630 may be provided as a first input to the training management part 120.

In an embodiment, the second MRI image 620 ($I_{label}$) generated using the signals output from the second group G2 of coils may be directly provided as a second input to the training management part 120. In this case, the second MRI image 620 ($I_{label}$) is a label image, i.e., a second image 820.

However, as illustrated in FIG. 11A, according to a preferred embodiment of the present invention, the image generated by correcting the second MRI image 620, i.e., the label image 820 ($I''_{label}$), may be used as a label for supervised learning. The label image generating part 130 is configured to generate the label image 820 ($I''_{label}$) by correcting the second MRI image 620.

The label generation process may further include generating a first corrected image ($I'_{label}$) by correcting the second MRI image 620 ($I_{input}$) in order to eliminate a correlation between noise included in the first MRI image 610 and noise included in the second MRI image 620.

If there is no correlation between noise included in the first MRI image 610 and noise included in the second MRI image 620, the second MRI image 620 ($I_{input}$) may become the first corrected image ($I'_{label}$) per se.

Furthermore, a label generation process for generating, by the label image generating part 130, the label image 820 ($I''_{label}$) from the second MRI image 620 ($I_{input}$) may include generating the label image 820 ($I''_{label}$) based on a difference in sensitivity between the first group G1 of coils and the second group G2 of coils.

By eliminating the difference in sensitivity between the coils, an image obtained by denoising the first MRI image 610 provided to the post-processing part 110 and an image obtained by denoising the label image 820 ($I''_{label}$) provided to the training management part 120 may be rendered identical.

The training management part 120 may calculate a loss value according to a loss function between the post-processed image 630 and the label image 820 ($I''_{label}$). Furthermore, update information P121 for changing a parameter θ of the post-processing part 110 may be generated so as to reduce the loss value according to the loss function. The training management part 120 may train the post-processing part 110 by changing the parameter θ of the post-processing part 110 using the update information P121.

When the MRI scanner 200 performs the data acquisition process multiple times, a plurality of different sets of the first image and the label image may be obtained. For example, the MRI scanner 200 may perform the data acquisition process N times in order to prepare N number of different sets of the first image and the label image.

With regard to two of the different data acquisition processes, a scan target (for example, a person) to be scanned by the MRI scanner 200 may be different. Alternatively, with regard to two of the different data acquisition processes, a scan target (for example, a person) to be scanned by the MRI scanner 200 may have a different posture.

The computing device 100 may finish training of the post-processing part 110 by repeating the training using the plurality of different sets of the first image and the label image.

Here, the first image 610 ($I_{input}$) may satisfy [Equation 5].

$$I_{input}=\Sigma_i s_i^H y_i=\Sigma_i s_i^H(s_i x+n_i)=\Sigma_i s_i^H s_i x+\Sigma_i s_i^H n_i$$

$$E[\Sigma_i s_i^H n_i]=\Sigma_i s_i^H E[n_i]=0 \quad \text{[Equation 5]}$$

In [Equation 5], the subscript i denotes an index for identifying the coils belonging to the first group G1, and $s_i$ denotes spatial sensitivity of corresponding coils.

Here, the second MRI image 620 ($I_{label}$) may satisfy [Equation 6].

$$I_{label}=\Sigma_j s_j^H y_j=\Sigma_j s_i^H(s_j x+n_j)=\Sigma_j s_j^H s_j x+\Sigma_j s_j^H n_j$$

$$E[\Sigma_j s_j^H n_j]=\Sigma_j s_j^H E[n_j]=0 \quad \text{[Equation 6]}$$

In [Equation 6], the subscript j denotes an index for identifying the coils belonging to the second group G2, and $s_j$ denotes spatial sensitivity of corresponding coils.

In [Equation 5] and [Equation 6], expectation values of the noise terms may be 0 and may be independent of each other. Furthermore, $n_i$ and $n_j$ are symmetric with each other.

Meanwhile, when the first image 610 ($I_{input}$) and the second MRI image 620 ($I_{label}$) are given as expressed in

[Equation 5] and [Equation 6], a loss function used by the training management part 120 may be defined as [Equation 7].

$$\text{loss}' = |f_\theta(I_{input}) - I_{label}|_2^2 \quad \text{[Equation 7]}$$

Here, $f_\theta(I_{input})$ represents the post-processed image 630.

Descriptions have been provided with reference to FIG. 5 on the assumption that a value (x) of the term obtained by eliminating noise from the MRI image 600 ($x+n_1$) input to the network 111 ($f_\theta$) is equal to a value (x) of the term obtained by eliminating noise from the other label image 604 ($x+n_2$) used as a label.

However, on the contrary, the left term $\Sigma_i s_i^H s_i x$ among the terms constituting $I_{input}$ is a value obtained by multiplying the true image (x) by $\Sigma_i s_i^H s_i$ in [Equation 5], and the left term $\Sigma_j s_j^H s_j x$ among the terms constituting the second MRI image 620 ($I_{label}$) is a value obtained by multiplying the true image x by $\Sigma_j s_j^H s_j$ in [Equation 6]. That is, the value of the term obtained by eliminating noise from $I_{input}$ of [Equation 5] and the value of the term obtained by eliminating noise from $I_{label}$ of [Equation 6] are different from each other.

Therefore, there may occur an issue in which a combination of [Equation 5], [Equation 6], and [Equation 7] do not satisfy the assumption given with regard to FIG. 5. This issue may be resolved by correcting the loss function as expressed in [Equation 8].

$$\text{loss} = |(\Sigma_j s_j^H s_j) f_\theta(I_{input}) - (\Sigma_i s_i^H s_i) I_{label}|_2^2 \quad \text{[Equation 8]}$$

That is, the loss function may be redefined using a value obtained by multiplying $f_\theta(I_{input})$ by $\Sigma_j s_j^H s_j$ that is a proportional constant value included in $I_{label}$ and a value obtained by multiplying $I_{label}$ by $\Sigma_i s_i^H s_i$ that is a proportional constant value included in $f_\theta(I_{input})$.

In an embodiment of the present invention, $I_{input}$ of [Equation 5] is used as the first image provided to the post-processing part 110, $I_{label}$ of [Equation 6] is used as the label image provided to the training management part 120, and the loss of [Equation 8] is used as the loss function. Here, the above first embodiment satisfies the assumption given with regard to FIG. 5. That is, even if the post-processing part 110 is trained using the second MRI image 620 ($I_{label}$) as a label image, a training effect may be achieved, which is the same as or similar to the effect exhibited when training the post-processing part 110 using the true image (x) for the first image 610 ($I_{input}$) as a label image.

In another embodiment of the present invention, $I_{input}$ of [Equation 5] is used as the first image provided to the post-processing part 110, $I_{label}$ of [Equation 9] shown below is used as the label image provided to the training management part 120, and the loss' of [Equation 7] is used as the loss function. Here, the above second embodiment satisfies the assumption given with regard to FIG. 5. Therefore, the same training effect as that of the first embodiment may be achieved.

$$I_{label} = (\Sigma_j s_j^H s_j x + \Sigma_j s_j^H n_j)(\Sigma_i s_i^H s_i)/\Sigma_j s_j^H s_j \quad \text{[Equation 9]}$$

In another embodiment of the present invention, $I_{input}$ of [Equation 10] is used as the first image provided to the post-processing part 110, $I_{label}$ of [Equation 6] is used as the label image provided to the training management part 120, and the loss' of [Equation 7] is used as the loss function. Here, the above third embodiment satisfies the assumption given with regard to FIG. 5. Therefore, the same training effect as that of the first embodiment may be achieved.

$$I_{input} = (\Sigma_i s_i^H s_i x + \Sigma_i s_i^H n_i)(\Sigma_j s_j^H s_j)/\Sigma_i s_i^H s_i \quad \text{[Equation 9]}$$

FIG. 11B illustrates an embodiment modified from the embodiment illustrated in FIG. 11A.

Hereinafter, descriptions about FIG. 11B will be provided with focus on differences with FIG. 11A.

The transform part 230 may transform the first MRI signal 510 into the first MRI image 610, and thereafter may transform the second MRI signal 520 into the second MRI image 620. To this end, the transform part 230 may include a buffer for storing the second MRI signal 520 while transforming the first MRI signal 510 into the first MRI image 610.

In FIGS. 11A and 11B, the transform part 230 may be a computing module including a programmed FPGA or dedicated calculation part and a memory.

In FIGS. 11A and 11B, the signals output from the first group of coils are input to the transform part 230 after being combined by a first signal combining part 241, and the signals output from the second group of coils are input to the transform part 230 after being combined by a second signal combining part 242. However, in the modified embodiment, all of the signals output from the coils belonging to the first and second groups may be directly input to the transform part 230 without passing through the first signal combining part 241 and the second signal combining part 242. Furthermore, the signals output from the first group of coils may be combined with each other in the transform part 230, and the signals output from the second group of coils may be combined with each other in the transform part 230.

Preferred Embodiment

FIG. 11C illustrates a configuration of a system, which is provided according to a preferred embodiment of the present invention, for performing a training method of a post-processing part for denoising an MRI image.

Described below with reference to FIG. 11C is a process of generating two images through a one-time data acquisition process in an MRI scanner and training a post-processing part by using the two images according to an embodiment of the present invention.

The post-processing part is a denoising network.

The MRI scanner 200 may include the plurality of coils 211, 212, 221, and 222, the transform part 230, and the image combining parts 251 and 252.

The plurality of coils included in the MRI scanner 200 are divided into a plurality of groups, for example, two groups. In the example of FIG. 11C, the coils 211 and 212 belong to the first group G1 among the plurality of groups and the coils 221 and 222 belong to the second group G2 among the plurality of groups.

When the one-time data acquisition process is performed in the MRI scanner 200, the 11th coil 211, the 12th coil 212, the 21st coil 221, and the 22nd coil 222 output an 11th MRI signal 511, a 12th MRI signal 512, a 21st MRI signal 521, and a 22nd MRI signal 522, respectively.

The transform part 230 may generate an 11th MRI image 611, a 12th MRI image 612, a 21st MRI image 621, and a 22nd MRI image 622 by transforming the 11th MRI signal 511, the 12th MRI signal 512, the 21st MRI signal 521, and the 22nd MRI signal 522, respectively.

In the present disclosure, an MRI image obtained by combining all of the 11th MRI image 611, the 12th MRI image 612, the 21st MRI image 621, and the 22nd MRI image 622 may be denoted by x. Here, each of the 11th MRI image 611, the 12th MRI image 612, the 21st MRI image 621, and the 22nd MRI image 622 may be referred to as an individual channel image and denoted by $y_i$.

Here, [Equation 11] is established.

$$y_i = s_i x + n_1 \quad \text{[Equation 11]}$$

Where, $x \in C^2$, $y_i \in C^2$, $s_i \in C^2$.

Here, $s_i$ is the coil sensitivity, and $n_i$ is the noise of $i^{th}$ channel image, modeled as zero mean Gaussian with the standard deviation of $\sigma_i$ for both real and imaginary axis. The matrix multiplication (or division) hereafter indicates Hadamard multiplication (or division).

In an embodiment, the transform part 230 may include an 11th transform part 2311 for generating the 11th MRI image 611 from the 11th MRI signal 511, a 12th transform part 2312 for generating the 12th MRI image 612 from the 12th MRI signal 512, a 21st transform part 2321 for generating the 21st MRI image 621 from the 21st MRI signal 521, and a 22nd transform part 2322 for generating the 22nd MRI image 622 from the 22nd MRI signal 522.

The first image combining part 251 may generate the first MRI image 610 ($I_{input}$) by combining the 11th MRI image 611 and the 12th MRI image 612.

The second image combining part 252 may generate the second MRI image 620 ($I_{label}$) by combining the 21st MRI image 621 and the 22nd MRI image 622.

The first MRI image 610 ($I_{input}$) and the second MRI image 620 ($I_{label}$) satisfy [Equation 12].

$$I_{input} = |\Sigma_j s_j^H y_j|$$

$$I_{label} = |\Sigma_i s_i^H y_i| \quad \text{[Equation 12]}$$

Where, j denotes the first group G1, and k denotes the second group G2. And $s_i^H$ is the hermitian of $s_i$. It is assumed that the two images cover all imaging volumes because most of the individual coils have relatively large volume coverage and are mutually coupled.

The first MRI image 610 ($I_{input}$) and the second MRI image 620 ($I_{label}$) may be provided to the computing device 100.

The first MRI image 610 may be provided as training input data of the post-processing part 110. The post-processing part 110 may output the post-processed image 630 generated by post-processing the first image 610 ($I_{input}$). The post-processed image 630 may be provided as a first input to the training management part 120.

The second MRI image 620 ($I_{label}$) may be input to the noise decorrelation part 131. The noise decorrelation part 131 is configured to transform the second MRI image 620 ($I_{label}$) so as to eliminate a correlation between first noise in the first MRI image 610 ($I_{input}$) and second noise in the second MRI image 620 ($I_{label}$).

The noise decorrelation part 131 is configured to output an intermediate label image 720 ($I'_{label}$) by transforming the second MRI image 620 ($I_{label}$).

These two images, $I_{input}$ and $I_{label}$, have different coil sensitivity weighting and may have noise correlation (e.g., mutual inductance between channels). Therefore, they need to be further processed to satisfy the three conditions, first, the paired images have independent noise, second, they have the same noise-free image, and third, the expectation of the noise is zero. In order to impose the independence of noise between the two images, a generalized least-square solution is applied, resulting in the following modification in the label image as indicated by Equation 13.

The intermediate label image 720 ($I'_{label}$), the second MRI image 620 ($I_{label}$), and the first MRI image 610 ($I_{input}$) have a relationship as expressed in [Equation 13].

$$I'_{label} = \alpha I_{input} + \beta I_{label} \quad \text{[Equation 13]}$$

with $\alpha = -\sigma_{JK}^2/\text{root}\{\sigma_J^2\sigma_K^2-(\sigma_{JK}^2)^2\}$, and $\beta = -\sigma_J^2/\text{root}\{\sigma_J^2\sigma_K^2-(\sigma_{JK}^2)^2\}$ Here, $\sigma_J^2$, $\sigma_K^2$, and $\sigma_{JK}^2$ are matrices ($\in R^2$) calculated as $\text{var}(|\Sigma_j s_j^H y_j|)$, $\text{var}(|\Sigma_k s_k^H y_k|)$, and $\text{cov}(|\Sigma_j s_j^H y_j|, |\Sigma_k s_k^H y_k|)$, respectively. In these equations, all operations are voxel-wise operations. As a result, $I_{label}$ is modified to $I'_{label}$, and thereby the noise covariance between $I_{input}$ and $I'_{label}$ becomes zero.

In this specification, $I'_{label}$ may be called as an intermediate label image 720.

If there is no correlation between first noise in the first MRI image 610 ($I_{input}$) and second noise in the second MRI image 620 ($I_{label}$), the intermediate label image 720 ($I'_{label}$) is the same as the second MRI image 620 ($I_{label}$).

The intermediate label image 720 ($I'_{label}$) may be input to a coil sensitivity compensation part 132.

The coil sensitivity compensation part 132 is configured to transform the intermediate label image 720 ($I'_{label}$) by compensating for a difference in sensitivity between the coils 211 and 212 of the first group and the coils 221 and 222 of the second group.

To impose the requirement of the same noise-free image, the coil sensitivity of $I'_{label}$ (i.e., $S'_K = \alpha|\Sigma_k s_k^H| + \beta|\Sigma_j s_j^H|$) is modified to match that of $I_{input}$ (i.e., $S_J = |\Sigma_j s_j^H|$) by multiplying the sensitivity ratio ($S_J/S'_K$) to $I'_{label}$ in each voxel, generating a final image ($I''_{label} = (S_J/S'_K) \cdot I'_{label}$). Since multiplying a coefficient is a linear process, the first condition of noise independence still holds after the processing.

In this specification, the final image $I''_{label}$ may be called as a label image 820.

The coil sensitivity compensation part 132 is configured to output the label image 820 ($I''_{label}$) by transforming the intermediate label image 720 ($I'_{label}$).

Here, covariance between first noise included in the first MRI image 610 ($I_{input}$) and third noise included in the label image 820 ($I''_{label}$) is zero. Furthermore, an image obtained by eliminating the first noise from the first MRI image 610 ($I_{input}$) and an image obtained by eliminating the third noise from the label image 820 ($I''_{label}$) are the same.

The above mentioned third condition of zero-mean noise is valid, assuming that the combined images have reasonably high SNR such that the noise characteristics within the image can be considered as Gaussian with zero mean.

The label image 820 ($I''_{label}$) may be provided as a second input to the training management part 120.

The training management part 120 may calculate a loss value according to a loss function between the post-processed image 630 and the label image 820 ($I''_{label}$). Furthermore, update information P121 for changing a parameter θ of the post-processing part 110 may be generated so as to reduce the loss value according to the loss function. The training management part 120 may train the post-processing part 110 by changing the parameter θ of the post-processing part 110 using the update information P121.

In this embodiment, for the training of a denoising network, the L2 loss is utilized as following Equation 14.

$$\text{loss} = |S'_K f_\theta(I_{input}) - S_J I'_{label}|_2^2 \quad \text{[Equation 14]}$$

where $f_\theta$ is the neural network. It is noted that the scaled version of $I'_{label}$ is used instead of $I''_{label}$ to avoid division. This loss function is calculated within a brain mask.

FIG. 12 illustrates a method of denoising an MRI image using a trained post-processing part according to an embodiment of the present invention.

The post-processing part illustrated in FIG. 12 may be one that has been trained using the method described with reference to FIGS. 11A and 11B.

The MRI scanner 200 may output the MRI image 600. The MRI image 600 may be an image generated using all of the coils included in the MRI scanner 200. The MRI image 600 may be an image in which noise (n) is added to a true image (x).

The output MRI image 600 may be input to the post-processing part 110 of the computing device 100. The post-processing part 110 may output the post-processed image 603. When the post-processing part 110 has been sufficiently trained according to an embodiment of the present invention, an error between the post-processed image and the true image 601 ($x$) may be very small.

A method of denoising an MRI image provided according to an embodiment of the present invention may include: outputting, by the MRI scanner 200, an MRI signal from the plurality of coils 211 included in the MRI scanner 200; and inputting, by the computing device 100, an MRI image generated using signals obtained from the plurality of coils to the post-processing part 110 included in the computing device 100 to generate a post-processed image obtained by denoising the MRI image.

Here, the post-processed part 110 may be one that has been supervised-trained according to a supervised learning method.

Figures 13, 14:
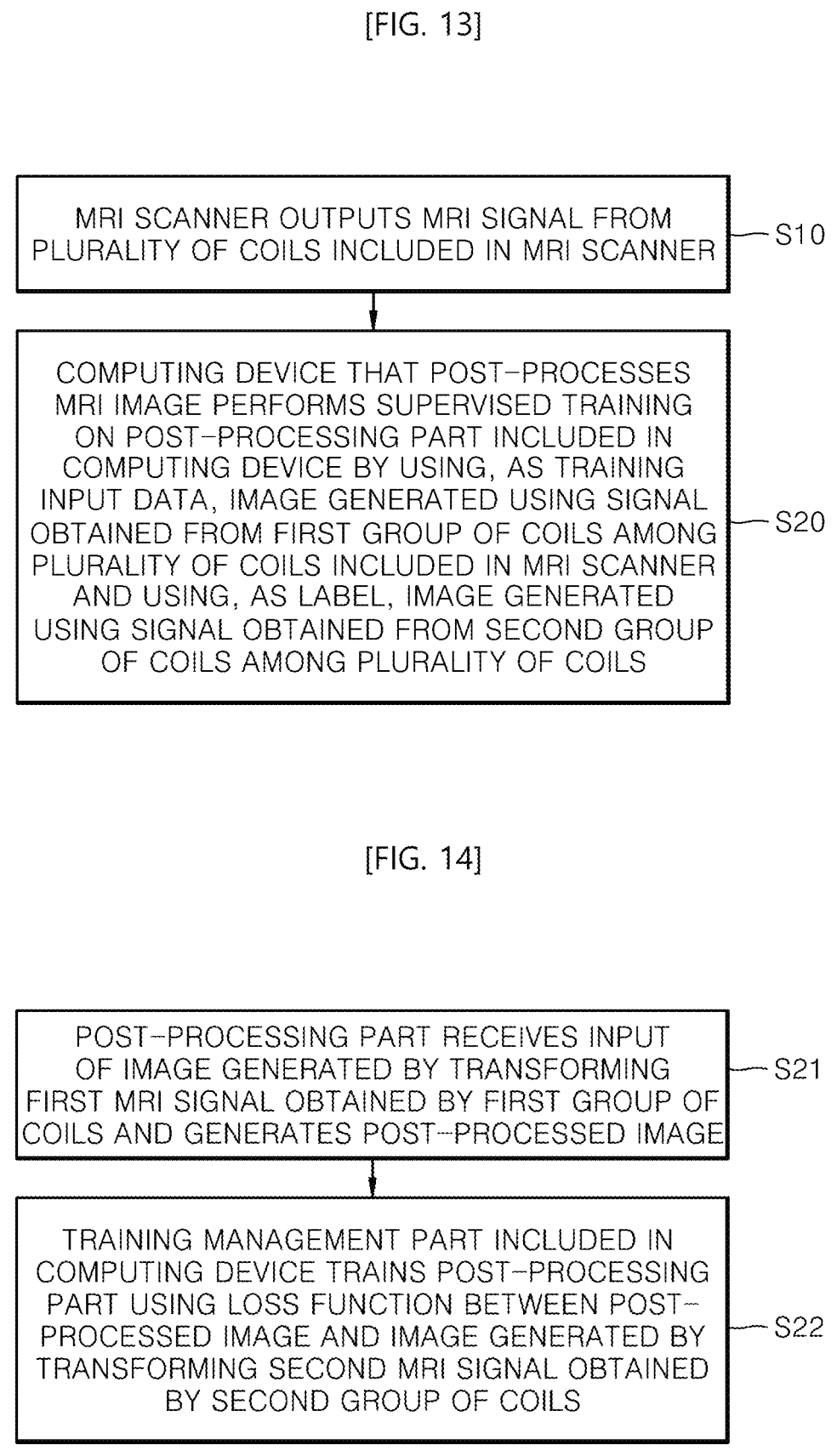

FIG. 13 is a flowchart illustrating a training method provided according to an embodiment of the present invention.

In operation S10, the MRI scanner 200 may output an MRI signal from the plurality of coils 211 included in the MRI scanner 200.

In operation S20, the computing device 100 that post-processes an MRI image may perform supervised learning on the post-processing part 110 included in the computing device 100 by using, as training input data, an image generated using a signal obtained from a first group of coils among the plurality of coils included in the MRI scanner 200 and using, as a label, an image generated using a signal obtained from a second group of coils among the plurality of coils.

FIG. 14 is a flowchart illustrating the supervised learning operation of FIG. 13 in detail.

Above supervised learning operation S20 may include operation S21 and operation S22.

In operation S21, the post-processing part 110 receives an input of the image 610 generated by transforming the first MRI signal 510 obtained by the first group of coils and generates the post-processed image 630.

In operation S22, the training management part 120 included in the computing device 100 trains the post-processing part 110 using a loss function between the post-processed image 630 and an image generated by transforming the second MRI signal 520 obtained by the second group of coils.

Here, the image generated by transforming the second MRI signal 520 may be the label image 820 ($I''_{label}$) illustrated in FIGS. 11A, 11B, and 11C.

FIG. 15 is a diagram illustrating the computing device shown in FIGS. 9, 10, and 12 from a hardware aspect.

The computing device 100 may include a device interface unit 3 capable of reading a computer-readable nonvolatile recording medium 2 and a processing unit 4.

The nonvolatile recording medium 2 may store a program including a first instruction code for executing a function of the post-processing part 110. The first instruction code may be referred to as a post-processing instruction code. The processing unit 4 may be configured to execute the function of the post-processing part 110 by reading and executing the first instruction code through the device interface unit 3.

Furthermore, the nonvolatile recording medium 2 may store a program including a second instruction code for executing a function of the training management part 120. The second instruction code may be referred to as a training management instruction code. The processing unit 4 may be configured to execute the function of the training management part 120 by reading and executing the second instruction code through the device interface unit 3.

The nonvolatile recording medium 2 may store a program including a third instruction code for executing: controlling, by the computing device 100, the MRI scanner 200 to operate so as to output an MRI signal from a plurality of coils included in the MRI scanner 200; and performing supervised learning on the post-processing part 110 included in the computing device 100 by using, as training input data, the first image 610 generated using a signal obtained from a first group of coils among the plurality of coils included in the MRI scanner 200 and using, as a label, the second image 820 generated using a signal obtained from a second group of coils among the plurality of coils. The processing unit 4 may be configured to perform a method of performing supervised learning on the post-processing part 110 by reading and executing the third instruction code through the device interface unit 3.

Here, the performing supervised learning may include: receiving, by the post-processing part 110, an input of the first image 610 generated by transforming the first MRI signal 510 obtained by the first group of coils to generate the post-processed image 630; and training, by the training management part 120, the post-processing part 110 using a loss function between the post-processed image 630 and the second image 820 generated by transforming the second MRI signal 520 obtained by the second group of coils.

The nonvolatile recording medium 2 may store a program including a fourth instruction code for executing: generating, by the computing device 100, a first K-space corresponding to the first MRI signal by transforming the first MRI signal and generating the first image 610 corresponding to the first MRI signal; and generating, by the computing device 100, a second K-space corresponding to the second MRI signal by transforming the second MRI signal and generating the second image 820 corresponding to the second MRI signal. The processing unit 4 may be configured to perform a method of generating the first image 610 and the second image 820 by reading and executing the fourth instruction code through the device interface unit 3.

According to the present invention, a specific technology for generating label data and training data for supervised learning of a post-processing part for denoising an MRI image can be provided.

Those skilled in the art could easily make various alterations or modifications to the above-mentioned embodiments of the present invention without departing the essential characteristics of the present invention. The claims that do not refer to each other may be combined with each other within the scope of understanding of the present disclosure.

ACKNOWLEDGEMENT

This work has been supported by the National Research Foundation of Korea (NRF) grant funded by the Korea government (MSIT) (No. NRF-2021R1A2B5B03002783).

This work has been supported by the National Research Foundation of Korea (NRF) grant funded by the Korea government (MSIT) (No. NRF-2022R1A4A1030579).

This work has been supported by the National Research Foundation of Korea (NRF) grant funded by the Korea government (MSIT) (No. NRF-2019M3C7A1031994).

This work is supported by the Korea Agency for Infrastructure Technology Advancement (KAIA) grant funded by the Ministry of Land, Infrastructure and Transport (Grant 21NPSS-C163415-01).

What is claimed is:

1. A magnetic resonance imaging (MRI) system comprising:

an MRI scanner including a first group of coils and a second group of coils; and a computing device including a post-processing part for post-processing an MRI image and a training management part, wherein the computing device is configured to:

generate a first MRI image based on a first group of MRI signals obtained from the first group of coils, the first MRI image being used as training input data for supervised learning of the post-processing part, and generating a label image based on a second group of MRI signals obtained from the second group of coils, the label image being used as a label for supervised learning of the post-processing part, and wherein the training management part is configured to perform supervised learning on the post-processing part using the training input data and the label, wherein the first MRI image and the label image are obtained through a same one-time data acquisition process performed by the MRI scanner.

2. The MRI system of claim 1, wherein generating the label image includes:

generating a second MRI image based on the second group of MRI signals;

generating an intermediate label image based on the second MRI image so as to eliminate a correlation between first noise in the first MRI image and second noise in the second MRI image; and generating the label image based on the intermediate label image so as to compensate for a difference in sensitivity between the first group of coils and the second group of coils.

3. The MRI system of claim 1, wherein the first MRI image is an image obtained by synthesizing images of a first group generated from the MRI signals of the first group obtained from the first group of coils, the label image is an image obtained by synthesizing images of a second group generated from the MRI signals of the second group obtained from the second group of coils, and the MRI scanner includes a transform part configured to generate the images of the first group from the MRI signals of the first group and generate the images of the second group from the MRI signals of the second group.

4. The MRI system of claim 2, wherein the intermediate label image is generated based on a weighted sum of the first MRI image and the second MRI image.

5. The MRI system of claim 1, wherein generating the label image includes:

generating a second MRI image based on the second group of MRI signals; and generating the label image based on the second MRI image so as to compensate for a difference in sensitivity between the first group of coils and the second group of coils.

6. The MRI system of claim 1, wherein while performing the supervised learning, the post-processing part is configured to receive an input of the first MRI image to generate a post-processed image, and the training management part is configured to train the post-processing part using a loss function between the post-processed image and the label image.

7. A neural network training method for training a post-processing part configured to receive an input of a magnetic resonance imaging (MRI) image and denoise the MRI image, the method comprising:

generating, by an MRI scanner including a first group of coils and a second group of coils, a first MRI image based on a first group of MRI signals obtained from the first group of coils;

generating, by the MRI scanner, a label image based on a second group of MRI signals obtained from the second group of coils; and performing, by a computing device, supervised learning on the post-processing part by using the first MRI image as training input data for supervised learning of the post-processing part and using the image as a label for supervised learning of the post-processing part, wherein the first image and the label image are obtained through a same one-time data acquisition process performed by the MRI scanner.

* * * * *